United States Patent
Nakamura et al.

(10) Patent No.: US 10,161,968 B2
(45) Date of Patent: Dec. 25, 2018

(54) RESISTOR AND CURRENT DETECTION DEVICE

(71) Applicant: KOA CORPORATION, Ina-shi, Nagano (JP)

(72) Inventors: Keishi Nakamura, Ina (JP); Kenji Kameko, Ina (JP)

(73) Assignee: KOA CORPORATION, Ina-shi (JP)

( * ) Notice: Subject to any disclaimer, the term of this patent is extended or adjusted under 35 U.S.C. 154(b) by 0 days.

(21) Appl. No.: 15/113,606

(22) PCT Filed: Jan. 30, 2015

(86) PCT No.: PCT/JP2015/052666
§ 371 (c)(1),
(2) Date: Jul. 22, 2016

(87) PCT Pub. No.: WO2015/115596
PCT Pub. Date: Aug. 6, 2015

(65) Prior Publication Data
US 2017/0003322 A1    Jan. 5, 2017

(30) Foreign Application Priority Data

Feb. 3, 2014 (JP) .................................. 2014-018342

(51) Int. Cl.
*G01R 15/14* (2006.01)
*G01R 1/20* (2006.01)
(Continued)

(52) U.S. Cl.
CPC ............ *G01R 15/146* (2013.01); *G01R 1/203* (2013.01); *G01R 19/0084* (2013.01); *G01R 19/0092* (2013.01); *G01R 35/005* (2013.01)

(58) Field of Classification Search
CPC ................ G01R 19/0092; G01R 1/203; G01R 19/0084; G01R 35/005; G01R 15/146
(Continued)

(56) References Cited

U.S. PATENT DOCUMENTS 765,889 A * 7/1904 Harris .................... G01R 1/203
                                                                 324/126
846,969 A * 3/1907 Wohl ..................... G01R 1/203
                                                                 324/126
(Continued)

FOREIGN PATENT DOCUMENTS

JP          61-53869 U    4/1986
JP          6-224014 A    8/1994
(Continued)

OTHER PUBLICATIONS

International Search Report dated Mar. 10, 2015, issued in counterpart International Application No. PCT/JP2015/052666 (2 pages).

*Primary Examiner* — Christopher McAndrew
(74) *Attorney, Agent, or Firm* — Westerman, Hattori, Daniels & Adrian, LLP (57) ABSTRACT

To provide a shunt resistor and a current detection device including the shunt resistor, to which a busbar, a board, and the like can be easily fixed with sufficient strength wherein only minimum processing of electrodes is required. Screwing members (bolt (14) and nut (15)) that are separate members from electrodes (12) of the resistor (10), are fixed on the electrodes (12). The current detection device includes the shunt resistor (10), which has at least a pair of electrodes (12). One screwing member (14) fixed beforehand on at least one electrode (12) is screw fastened with the other screwing member (15) while disposing a prescribed intervening member (20) between the one screwing member and the other screwing member. Here, the prescribed intervening member (Continued)

(20) includes a board mounting a current detection circuit thereon and/or busbars.

2 Claims, 8 Drawing Sheets

(51) Int. Cl.
  *G01R 19/00* (2006.01)
  *G01R 35/00* (2006.01)
(58) Field of Classification Search
  USPC .......................................................... 324/126
  See application file for complete search history.

(56) References Cited

U.S. PATENT DOCUMENTS

| | | | | |
|---|---|---|---|---|
| 892,554 | A * | 7/1908 | Roller | G01R 1/203 |
| | | | | 324/126 |
| 906,498 | A * | 12/1908 | Weston | G01R 1/203 |
| | | | | 324/126 |
| 1,046,465 | A * | 12/1912 | Hoyt | H01R 31/08 |
| | | | | 324/126 |
| 1,050,694 | A * | 1/1913 | Roller | G01R 1/203 |
| | | | | 324/126 |
| 7,170,295 | B2 * | 1/2007 | Hetzler | G01R 1/203 |
| | | | | 29/610.1 |
| 9,378,873 | B2 * | 6/2016 | Yoshioka | H01C 1/144 |
| 2004/0263150 | A1 * | 12/2004 | Hetzler | G01R 1/203 |
| | | | | 324/126 |
| 2008/0030208 | A1 * | 2/2008 | Aratani | G01R 1/203 |
| | | | | 324/713 |
| 2009/0224768 | A1 | 9/2009 | Dollansky et al. | |
| 2012/0229247 | A1 * | 9/2012 | Yoshioka | G01R 1/203 |
| | | | | 338/49 |

FOREIGN PATENT DOCUMENTS

| | | | | |
|---|---|---|---|---|
| JP | 2012109474 A * | 6/2012 | ............ | H01C 13/00 |
| JP | 2012-217276 A | 11/2012 | | |
| JP | 2012531760 A | 12/2012 | | |
| JP | 2013-99168 A | 5/2013 | | |
| JP | 2014-85245 A | 5/2014 | | |
| JP | 2014-202623 A | 10/2014 | | |
| WO | 2010/121841 A1 | 10/2010 | | |
| WO | 2011/068205 A1 | 6/2011 | | |

\* cited by examiner

RESISTOR AND CURRENT DETECTION DEVICE

TECHNICAL FIELD

The present invention relates to a shunt resistor and a current detection device, which uses the resistor.

BACKGROUND ART

Since the past, a method of fixing a shunt resistor to a busbar with using a bolt and a nut is known. In the method, holes are in advance formed in electrode portions of the shunt resistor and the busbar, and they are fixed with the bolt through the holes and the nut fastened thereto. Also, an electrode portion of the shunt resistor is in advance formed like a bolt, and a busbar is fixed to the shunt resistor by using a nut fastened with the bolt (see WO 2011-068205 as an example)

However, in the fixing method with using the bolt and the nut, when they move freely each other, work for fixing them might become troublesome. When a hole in the electrode portion is made to be a female screw, a power concentrates on the thread of the screw. The hardness of copper material used for the electrodes is low. When the electrode is a thin plate, enough clinging strength might not be obtained.

There are cases that a circuit board, on which a current detection circuit is mounted, is fixed on a shunt resistor. For an example, a terminal formed on the circuit board is fixed to an electrode of the shunt resistor by soldering. In the case, there is a problem that a fixed position of the circuit board by the solder can not be determined exactly, and that fixing strength becomes insufficient.

SUMMARY OF INVENTION

Technical Problem

The invention has been made basing on above-mentioned circumstances. Thus an object of the invention is to provide a shunt resistor and a current detection device including the shunt resistor, where a busbar, a circuit board or so on can be fixed to the shunt resistor easily with sufficient strength only by requiring minimum processing of the fixing portion.

Solution to Problem

The shunt resistor has a structure, in which screwing members (a bolt and a nut) that are separate members from the electrode of the resistor, is fixed to the electrode. Because screwing members are fixed to the electrode, fixation works for fixing the busbar etc. become easy. Because the screwing members are separate members from the electrode, the screwing members having sufficient strength can be selected, and only minimum processing of the electrode is required.

The current detection device of the invention comprises a shunt resistor having at least a pair of electrodes; one screwing member that is a separate member from the electrode fixed beforehand to at least one electrode; the other screwing member to be screw fastened with the one screwing member; and a prescribed intervening member disposed and screw fastened between the one screwing member and the other screwing member.

BRIEF DESCRIPTION OF DRAWINGS

Left view of FIG. 1C is a cross-sectional view of the current detection device, and right view of FIG. 1C is front view of the current detection device of first embodiment of the invention.

DESCRIPTION OF EMBODIMENTS

Embodiments of the invention will be described below with referring to FIG. 1A through FIG. 6B, Like or corresponding parts or elements will be denoted and explained by same reference characters throughout views.

FIGS. 1A-1D show a current detection device of first embodiment, which includes a shunt resistor 10 having at least a pair of electrodes. The shunt resistor 10 is a metal resistor having a resistance body 11 consisting of metal alloy such as Cu—Mn—Ni etc. and a pair of metal plate-shaped electrodes 12,12 consisting of Cu etc. The shunt resistor 10 is provided with holes 13 in electrodes 12,12 for fixing a board 20. And the shunt resistor 10 is provided with holes at both ends of the electrodes for connecting to busbars.

An end face of the resistance body 11 and an end face of the electrode 12 are abutted and welded on each other by laser beam or electron beam welding etc. Detection terminals 16,16 are provided on the electrodes 12,12 at vicinity of the junction to the resistance body 11. The detection terminal 16 is a rod-shaped small piece consisting of metal such as Cu, and is fixed on the electrode 12 by welding etc. The board 20 consisting of glass-epoxy base material is mounted with a current detection circuit including a current detection IC, wiring patterns, signal output terminals (not shown) etc.

Screwing members (bolt 14 and nut 15), which are separate members from the electrodes, are fixed to the electrodes 12. A bolt 14 and a nut 15 of screwing members are provided with a male screwing portion 14a and a female screwing portion 15a (see FIG. 1C). And a prescribed intervening member (board 20 mounting a current detection circuit thereon) is disposed and screw fastened between the one screwing member (bolt 14) and the other screwing member (nut 15).

The board 20 is provided with wiring patterns connecting to detection terminals 16. The voltage caused by the current flowing through the resistance body 11 from the electrodes 12 is picked up by detection terminals 16 and the signal is processed by the current detection IC and outputted from output terminals of the board 20 as a detection voltage. Instead of the board 20, a busbar for supplying currents can be interposed and fixed for connecting to the electrode 12 by using a pair of screw fastening members as an intervening member.

Figure 1A:
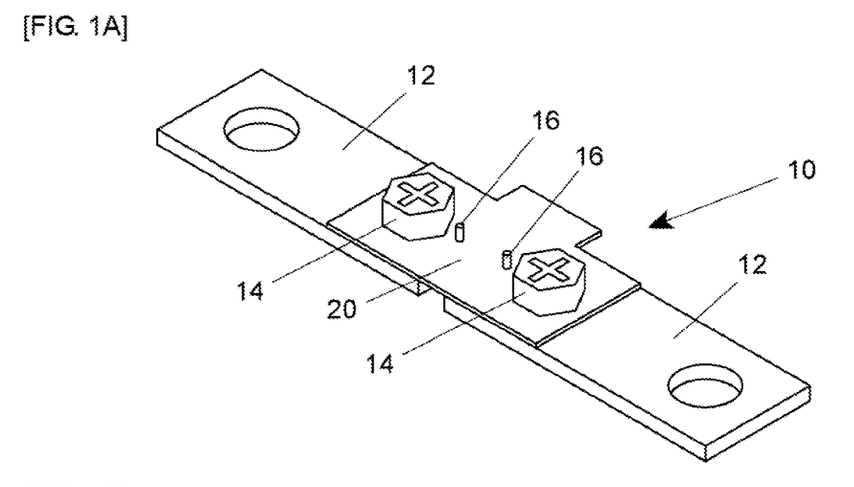
FIG. 1A is a perspective view of front side of the current detection device of first embodiment of the invention.
Figure 1B:
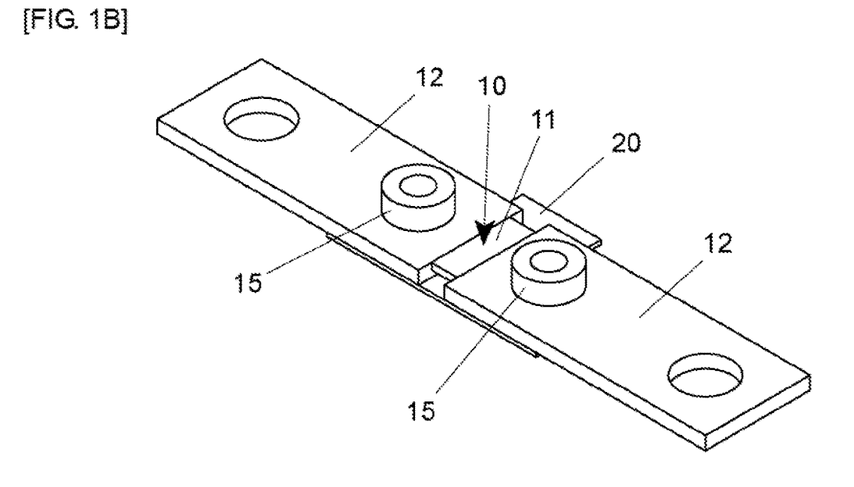
FIG. 1B is a perspective view of back side of the current detection device of first embodiment of the invention.
Figure 1C:
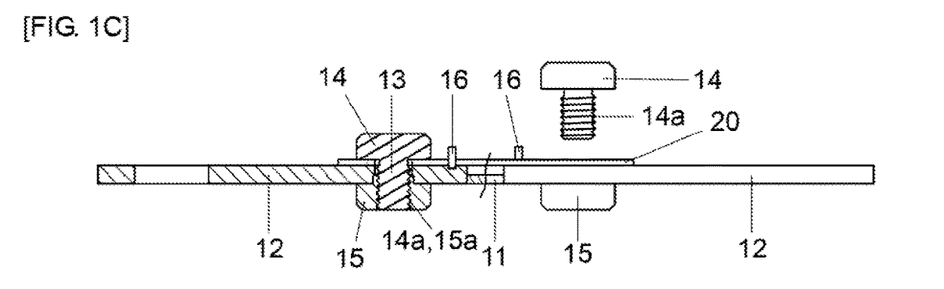
Figure 1D:
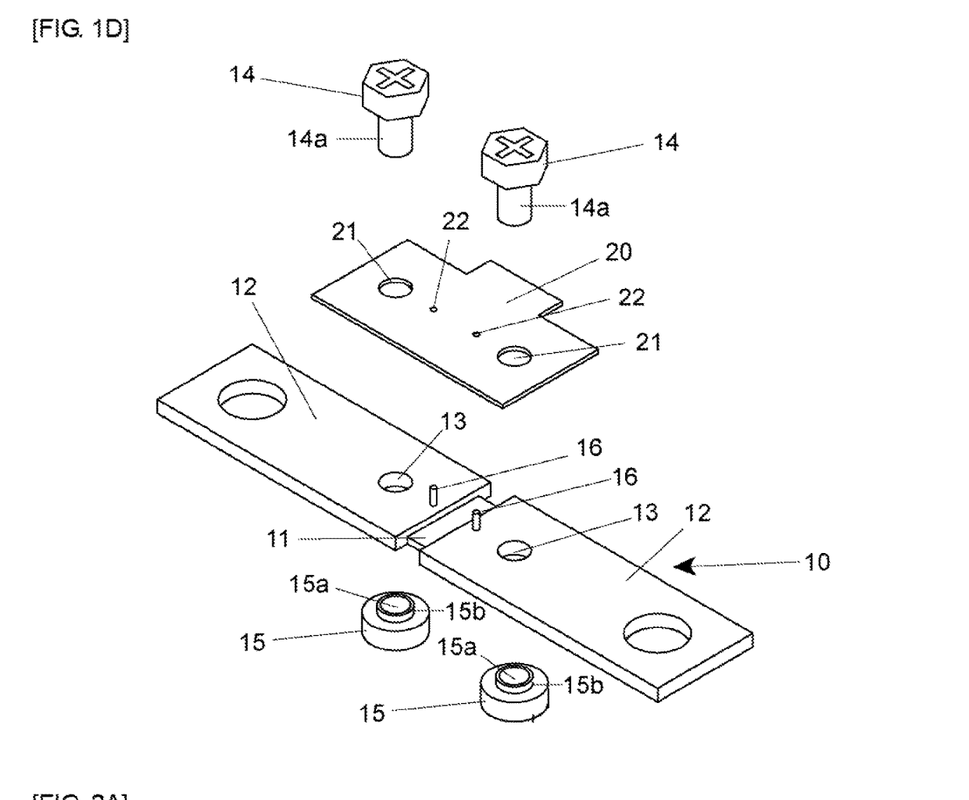
FIG. 1D is an exploded perspective view of the current detection device of first embodiment of the invention.

Board 20 is provided with holes 21 for inserting bolts 14 and holes 21 for inserting detection terminals 16 (see FIG. 1D). Board 20 is put on shunt resistor 10, and holes 21 of board 20 are aligned to holes 13 of shunt resistor 10. Detection terminals 16 are inserted into holes 22 of board 20, and bolts 14 are inserted through holes 21 and holes 13 from top side. And then screw fastened by nuts 15 from bottom side. Then board 20 as an intervening member is disposed and screw fastened to the shunt resistor by a pair of screw fastening members.

The bolt 14 of screwing member is provided with a male screwing portion 14a The nut 15 of screwing member is provided with a female screwing portion 15a and a convex portion 15b for press fitting into the hole 13. Outer diameter of convex portion 15b is a little larger than inner diameter of the hole 13. Then the convex portion 15b of nut 15 is press fit into the hole 13, and the nut 15 is securely fixed to the hole 13 in the electrode 12. Further, the convex portion 15b may be fixed to the electrode 12 by welding. As materials for these screwing members, copper, brass, stainless steel, and titanium etc. can be used.

The nut 15, which is one of the screwing members, contacts to lower surface of the electrode 12 at surroundings of the hole 13. That is, the nut 15 abuts to lower surface of the electrode 12. The nut 15 is provided with the convex portion 15b press fit into the hole 13 in the electrode 12. Then outer surface of convex portion 15b of the nut 15 contacts to inner surface of the hole 13 in the electrode 12.

Accordingly the nut 15 is fixed to the hole 13 in the electrode 12 beforehand, then the board 20 can be fixed to the shunt resistor 10 easily with sufficient strength only by inserting male portion 14a of the bolt 14 into the hole 21 in the board 20, and screw fastening the male portion of the bolt 14 into the female portion 15a of the nut 15, which is fixed beforehand to the hole 13 in the electrode 12. Since the screwing member is a separate member from the electrode, it is possible to select the material of the screwing member to have sufficient strength. The electrodes 12 has been only processed to have holes 13 for inserting the bolts 14, then the board 20 can be installed to the shunt resistor 10 easily only by minimum processing of the electrodes 12.

The detection terminals 16 are formed on top side surface (one surface) of the electrode 12. The screwing members (nut 15 in the embodiment) are fixed beforehand on bottom side surface (another surface) of the electrodes 12, which is different surface from the surface where the detection terminals 16 are formed. Then in case of fixing the board 20 on the shunt resistor 10 with the bolt 14 and the nut 15, because the board 20 connected to the detection terminals 16 and the electrodes 12 is sandwiched between the bolt 14 and the nut 15, they can be stably fixed.

Figure 2A:
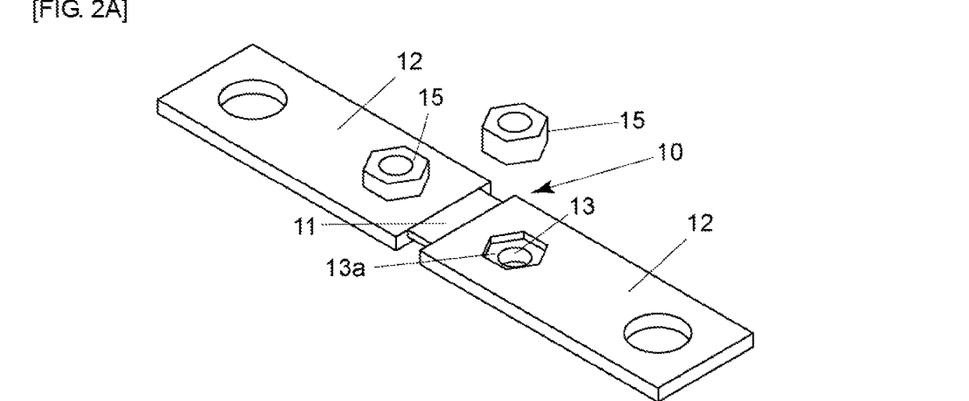
FIG. 2A is a perspective view of the current detection device of second embodiment of the invention.
Figure 2B:
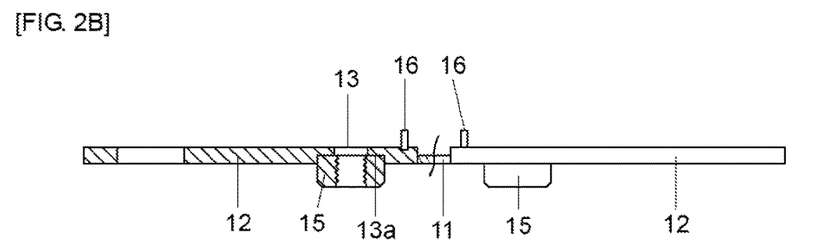
FIG. 2B is a cross-sectional view of the current detection device of second embodiment of the invention.

FIGS. 2A-2B shows the shunt resistor of second embodiment of the invention. In the embodiment, hexagonal concave portion 13a is formed in surroundings of the hole 13 in the electrode 12. Accordingly the nut 15 is fitted into the concave portion 13a and prevented from idle rotating. Though the nut 15 is not provided with the convex portion 15b different from first embodiment, the nut 15 is securely fixed to the electrode 12 beforehand so as not to come off easily. The nut 15 may be press fit into the concave portion 13a, the nut 15 may be welded to the concave portion 13a, or the nut 15 may be adhered with the adhesive. Other than hexagon, circle shape etc. may be acceptable to the shape of the concave portion 13a, as long as the nut 15 can be positioned in the electrode 12.

Accordingly, because the nut 15 is beforehand fixed to the hole 13 in the electrode 12 as well as first embodiment, the board 20 can be fixed to the shunt resistor 10 easily with sufficient strength only by inserting the bolt 14 into the hole 21 of the board 20 and the hole 13 in the electrode 12 and screw fastening the bolt 14 to the nut 15.

Figure 3:
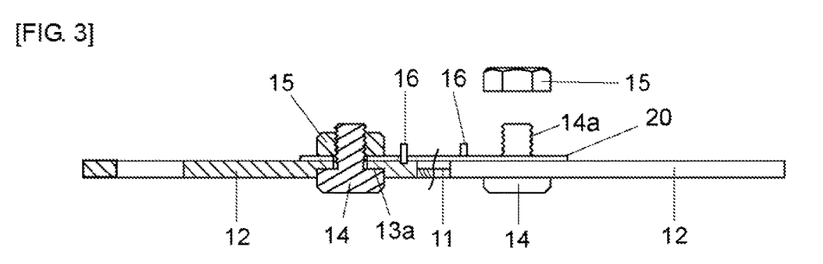
FIG. 3 is a cross-sectional view of the current detection device of third embodiment of the invention.
Figure 4A:
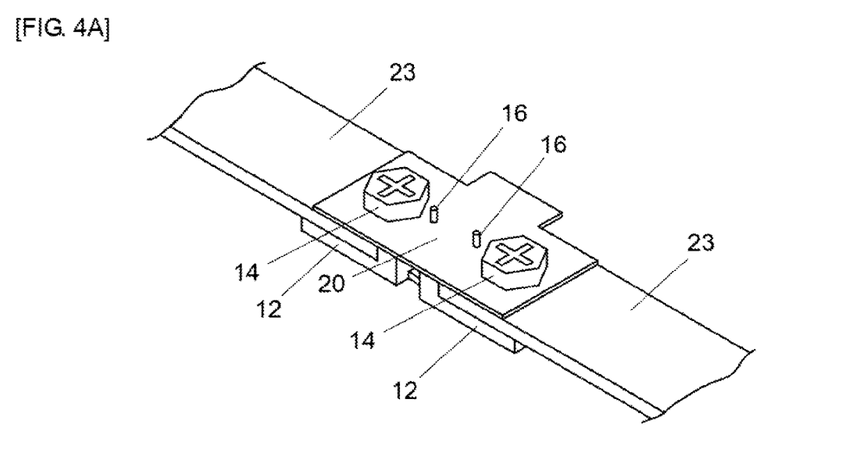
FIG. 4A is a perspective view of front side of the current detection device of fourth embodiment of the invention.
Figure 4B:
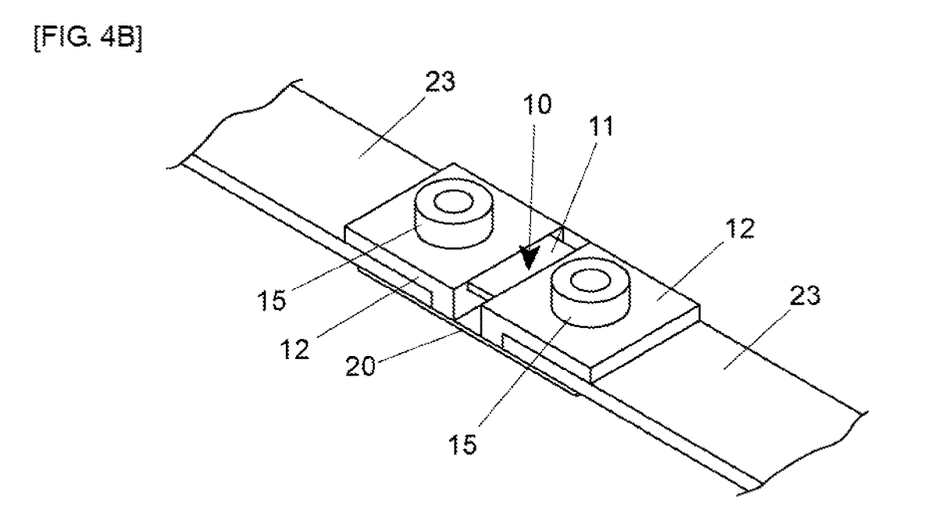
FIG. 4B is a perspective view of back side of the current detection device of fourth embodiment of the invention.
Figure 4C:
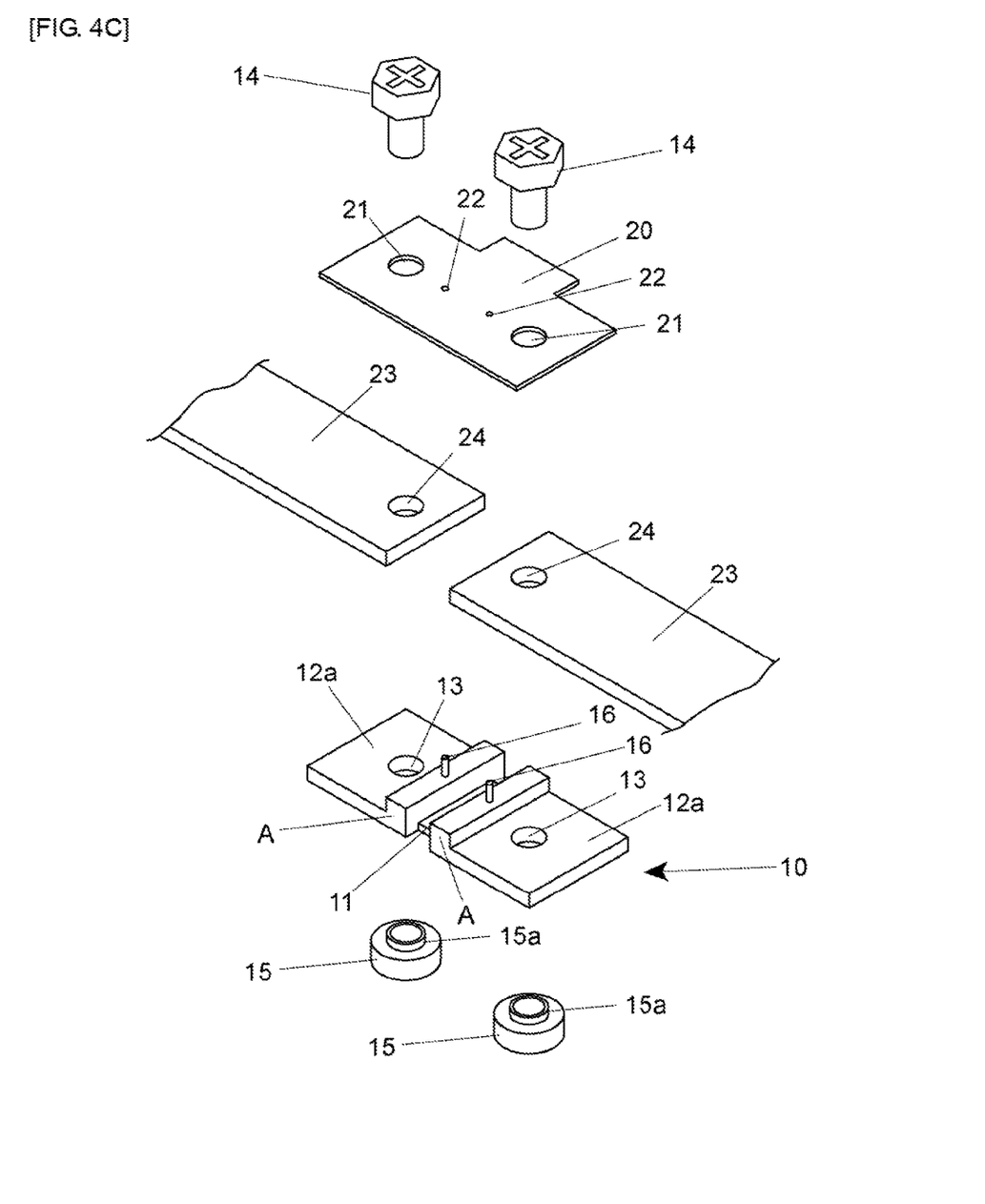
FIG. 4C is an exploded perspective view of the current detection device of fourth embodiment of the invention.
Figure 4D:
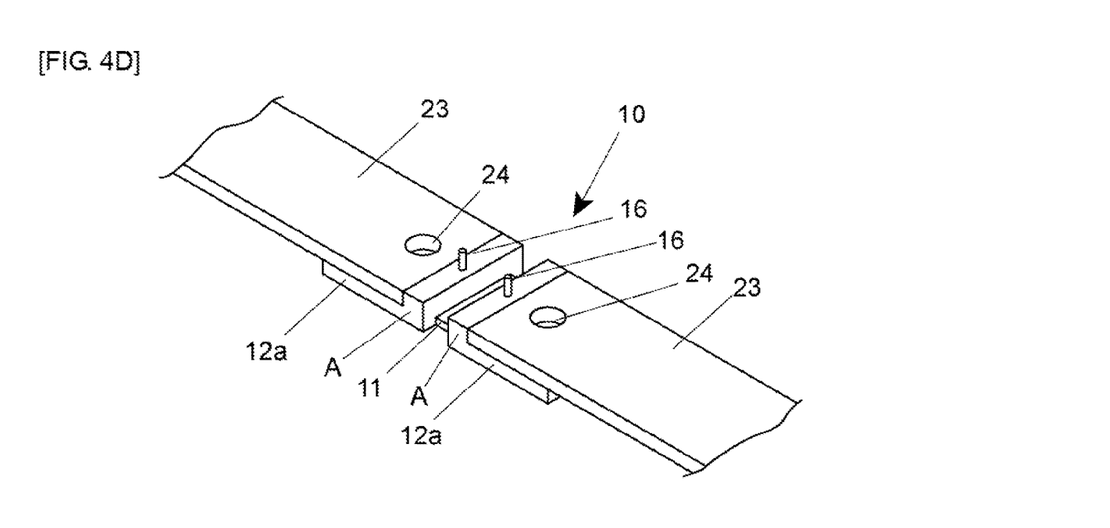
FIG. 4D is a perspective view of the current detection device of fourth embodiment of the invention at a stage where a busbar has been fixed.

FIG. 3 shows a current detection device of third embodiment of the invention. The embodiment is a modified example of second embodiment. Hexagonal head of bolt 14 that is one of the screw members is fixed beforehand in concave portion 13a formed in the electrode 12. And the nut 15 that is the other of the screw members is screw fastened from the other side to the male screw portion 14a of the bolt 14. The bolt 14 is beforehand fixed to the electrode 12 by press fitting, welding, or adhering etc. as well as the other embodiments. Accordingly the board 20 can be installed to the shunt resistor 10 easily with sufficient strength as well as the other embodiments.

FIGS. 4A-4D shows a current detection device of fourth embodiment of the invention. In the embodiment, the board 20 mounting a current detection circuit thereon and busbar 23 are fixed to shunt resistor 10 with screwing members 14,15 (see FIG. 4A-4B). The electrode 12a is provided with thick portion A and thin portion other than A where difference is almost equal to thickness of the busbar 23. When installing the busbar 23 on the thin portion, upper surface of the busbar 23 and upper surface of thick portion A become equal height, and it becomes same flat surfaces (see FIG. 4D).

The board 20 is provided with the holes 21 for inserting the bolts 14 and the holes 22 for inserting the detection terminals 16 as well as the first embodiment. The busbars 23 is provided with the holes 24, which is formed at a position corresponding to the holes 21 in the board 20 and the holes 13 in the electrodes 12a for inserting the bolts 14. The bolt 14 is inserted through the hole 21 in the board 20, the hole 24 in the busbar 23, and the hole 13 in the electrode 12a and screw fastened with the nut 15, which is fixed beforehand to bottom side surface of the electrode 12a. The nut 15 is provided with the convex portion 15a, which is press fit into the hole 13 in the electrode 12a, and the nut 15 being fixed to the electrode 12a as well as first embodiment (see FIG. 4C).

According to above mentioned structure, when the busbar 23 is fixed to the electrode 12a, top surface of busbar 23 and top surface of thick portion A becomes almost flat surfaces. Then advantages are caused, such that putting the board 20 thereon becomes easy, a direction where the busbar is fixed is restricted, and short circuit can be prevented from busbars themselves contacting according to rotation of the busbars. Because the busbars 23 and the board 20, on which a current detection circuit is mounted thereon, can be fixed to the shunt resistor 10 simultaneously with screw members, these intervening members can be fixed to the shunt resistor easily with sufficient fixing strength.

Figure 5A:
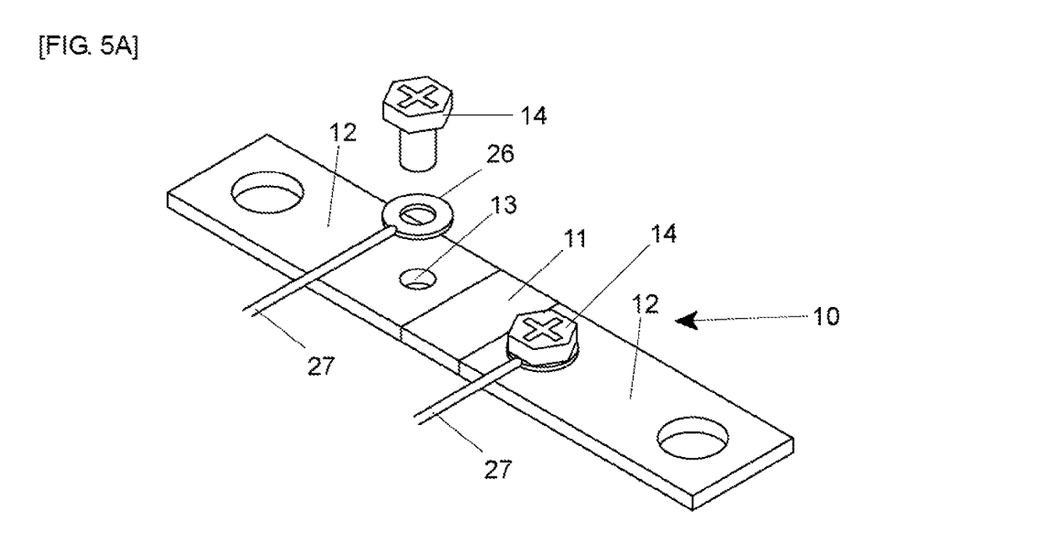
FIG. 5A is a perspective view of front side of the current detection device of fifth embodiment of the invention.
Figure 5B:
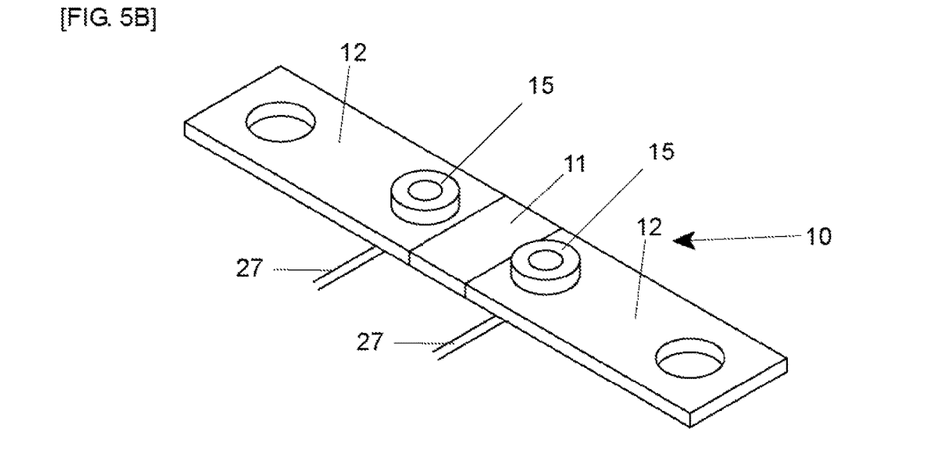
FIG. 5B is a perspective view of back side of the current detection device of fifth embodiment of the invention.

FIGS. 5A-5B shows a current detection device of fifth embodiment of the invention. In the embodiment, detection wires 27 connecting to washer 26 are fixed to both electrodes 12 of the shunt resistor 10 with using a pair of screwing members consisting of the bolt 14 and the nut 15. The electrode 12 is provided with the hole 13. The bolt 14 is inserted through the washer 26 and the hole 13 from top side of the electrode 12, and screw fastened with the nut 15, which is fixed to bottom side of the electrode 12 beforehand. Then detection wire 27 connecting to washer 26 can be fixed to the electrode 12 easily by the bolt 14 screw fastening with the nut 15. The nut 15 is fixed to the electrode 12 beforehand by press fitting of convex portion, forming concave portion, welding, or adhering.

Figure 6A:
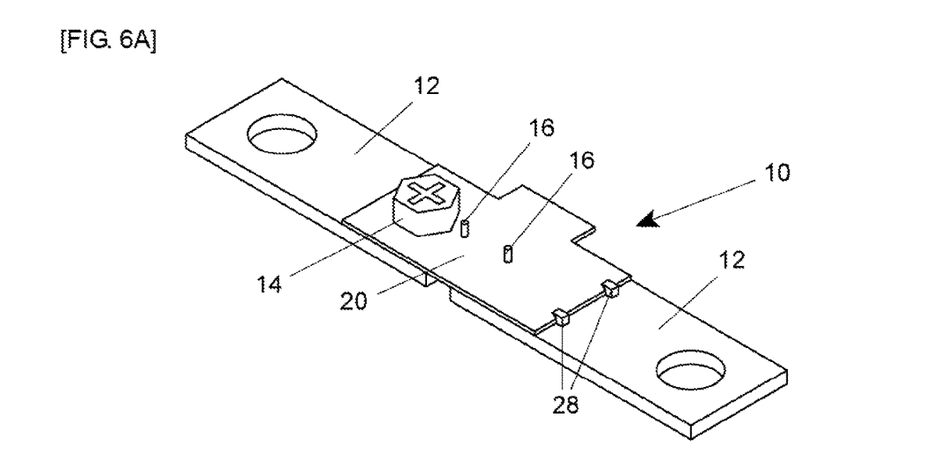
FIG. 6A is a perspective view of front side of the current detection device of sixth embodiment of the invention.
Figure 6B:
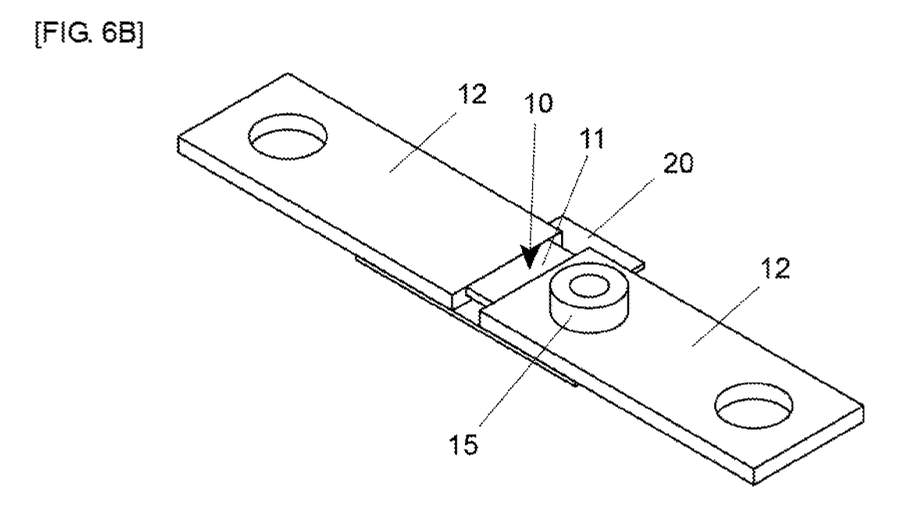
FIG. 6B is a perspective view of back side of the current detection device of sixth embodiment of the invention.

FIGS. 6A-6B shows a current detection device of sixth embodiment of the invention. In the embodiment, the current detection device including a shunt resistor 10 having a pair of electrodes 12 is provided with a prescribed intervening member (board 20). However only one side of the intervening member is fixed to the electrode 12 with using a pair of screw members. That is, one of the screwing members (nut 15) is fixed on one side of the electrode 12 beforehand, and the other screwing member (bolt 14) screw fastened with the one of the screwing members (nut 15) while disposing the intervening member (board 20) therebetween. The other side of intervening member (board 20) is not fixed on the electrode 12 with using the pair of screwing members but fixed to the electrode 12 with using locking members 28. Other structures are same to the first embodiment.

The current detection device can be manufactured by fixing the nut 15 on bottom surface of the electrode 12 only at one side of the electrode 12, fixing the board 20 with locking members 28 at the other side of the electrode 12, inserting the bolt 14 through the hole 21 in the board 20 and the hole 13 in the electrode 12 (see FIG. 1C), and screw fastening the bolt 14 with the nut 15 fixed on the electrode beforehand. Even though only one side of the intervening member is fixed at only one side of the electrode 12 with a pair of screwing members, the board 20 can be mounted to the shunt resistor 10 easily with sufficient strength.

Although embodiments of the invention have been explained, however the invention is not limited to above embodiments, and various changes and modifications may be made within scope of the technical concepts of the invention.

INDUSTRIAL APPLICABILITY

The invention can be suitably used for the current detection devices, which can fix an intervening member such as a board, busbars etc, on a shunt resistor easily with sufficient strength.

The invention claimed is:
1. A current detection device comprising:
   a shunt resistor having at least a pair of electrodes;
   one screwing member that is a separate member from the electrodes fixed on at least one electrode so as not to come off;
   a second screwing member to be a pair of screwing members with the one screwing member;
   a pair of voltage detection terminals provided on the pair of electrodes; and
   a prescribed intervening member disposed and screw fastened between the one screwing member and the second screwing member,
   wherein the prescribed intervening member is connected to the pair of voltage detection terminals.
2. The current detection device of claim 1, wherein the prescribed intervening member is a board mounting a current detection circuit thereon.

* * * * *

UNITED STATES PATENT AND TRADEMARK OFFICE
CERTIFICATE OF CORRECTION

PATENT NO. : 10,161,968 B2
APPLICATION NO. : 15/113606
DATED : December 25, 2018
INVENTOR(S) : Keishi Nakamura et al.

Page 1 of 1

It is certified that error appears in the above-identified patent and that said Letters Patent is hereby corrected as shown below:

In the Claims

Column 6 Lines 26-28 Claim 1:
Change
a prescribed intervening member disposed and screw fastened between the one screwing member and the second screwing member, To be
a prescribed intervening member and the electrode disposed and screw fastened between the one screwing member and the second screwing member, Column 6 Lines 29-30 Claim 1:
Change
wherein the prescribed intervening member is connected to the pair of voltage detection terminals.

To be
wherein the prescribed intervening member is connected to the pair of voltage detection terminals, and the prescribed intervening member includes holes for inserting the second screwing member and holes for inserting the pair of voltage detection terminals.

Signed and Sealed this
Twelfth Day of March, 2019

Andrei Iancu
*Director of the United States Patent and Trademark Office*